(12) United States Patent
Schmitz et al.

(10) Patent No.: US 7,262,460 B2
(45) Date of Patent: Aug. 28, 2007

(54) VERTICAL INSULATED GATE TRANSISTOR AND MANUFACTURING METHOD

(75) Inventors: Jurriaan Schmitz, Hengelo (NL); Raymond J. E. Hueting, Helmond (NL); Erwin A. Hijzen, Blanden (BE); Andreas H. Montree, Valkenswaard (NL); Michael A. A. In't Zandt, Veldhoven (NL); Gerrit E. J. Koops, Kessel-Lo (BE)

(73) Assignee: NXP B.V., Eindhoven (NL)

( * ) Notice: Subject to any disclaimer, the term of this patent is extended or adjusted under 35 U.S.C. 154(b) by 220 days.

(21) Appl. No.: 10/538,216

(22) PCT Filed: Dec. 8, 2003

(86) PCT No.: PCT/IB03/06015

§ 371 (c)(1),
(2), (4) Date: Jun. 9, 2005

(87) PCT Pub. No.: WO2004/055904

PCT Pub. Date: Jul. 1, 2004

(65) Prior Publication Data

US 2006/0049453 A1    Mar. 9, 2006

(30) Foreign Application Priority Data

Dec. 14, 2002    (GB)    ................... 0229217.5

(51) Int. Cl.
*H01L 29/76*    (2006.01)
*H01L 29/94*    (2006.01)
*H01L 31/00*    (2006.01)

(52) U.S. Cl. .............. 257/330; 438/270; 438/589
(58) Field of Classification Search ........... 257/330, 257/331, 332, 333, 342; 438/259, 270, 271, 438/587, 588, 589
See application file for complete search history.

(56) References Cited

U.S. PATENT DOCUMENTS

| | | | |
|---|---|---|---|
| 5,258,634 A * | 11/1993 | Yang | 257/316 |
| 6,444,528 B1 | 9/2002 | Murphy | |
| 6,593,613 B1 * | 7/2003 | Alsmeier et al. | 257/306 |
| 6,744,097 B2 * | 6/2004 | Yoo | 257/321 |

FOREIGN PATENT DOCUMENTS

| | | |
|---|---|---|
| JP | 55133574 | 1/1981 |
| JP | 09181311 | 11/1997 |

* cited by examiner

*Primary Examiner*—Richard T. Elms
*Assistant Examiner*—Allison Bernstein
(74) *Attorney, Agent, or Firm*—Peter Zuwilski

(57) ABSTRACT

A vertical insulated gate transistor is manufactured by providing a trench (26) extending through a source layer (8) and a channel layer (6) towards a drain layer (2). A spacer etch is used to form gate portions (20) along the trench side walls, a dielectric material (30) is filled into the trench between the sidewalls gate portions (20), and a gate electrical connection layer (30) is formed at the top of the trench electrically connecting the gate portions (20) across the trench.

11 Claims, 4 Drawing Sheets

VERTICAL INSULATED GATE TRANSISTOR AND MANUFACTURING METHOD

The invention relates to a vertical insulated gate transistor and method for manufacturing it.

An example of a prior art trench semiconductor structure is illustrated in FIG. 1. An n-type drain layer 4 is provided over an n+ substrate 2, and a p-type body layer 6 is provided on the drain layer 4. A trench 26 extends through the body layer 6 as far as the drain layer 4, and includes a conductive gate 20 insulated from the body layer by a gate insulator 18. N+ source diffusions 8 are provided adjacent to the trench.

In use, a voltage is applied to the gate electrode to control a channel 16 extending in the body layer 6 adjacent to the trench 26 between the source 8 and drain 4.

A problem with this structure is the capacitance between the gate and drain, since the base of the trench is in contact with the drain. This capacitance can give rise to problems, and in particular to the Miller effect. The capacitance should therefore be minimised.

A known approach to reducing this capacitance is described in U.S. Pat. No. 6,444,528 to Murphy, which suggests providing a thicker insulator at the base of the trench. U.S. Pat. No. 6,444,528 describes forming a second trench at the base of the trench and growing selective oxide in the second trench to form this thicker insulator.

However, this approach is complex to manufacture and there is accordingly a need for a simpler approach to manufacturing such structures.

According to the invention there is provided a method of manufacturing a vertical insulated gate transistor comprising the steps of: providing a semiconductor body having opposed first and second major surfaces; forming a trench extending vertically from the first major surface towards the second major surface; forming a gate dielectric layer on the sidewalls and base of the trench; depositing a conducting gate material layer on the gate dielectric layer on the sidewalls and base of the trench; carrying out a spacer etch to remove the gate material layer from the base of the trench leaving gate material on the sidewalls forming gate elements; filling dielectric into the trench between the sidewalls; and forming a gate electrical connection layer across the top of the trench electrically connecting the gate material layer across the trench.

By forming an electrical connection layer at the top of the trench the electrical connection layer reduces the resistance of the gates. When using narrow gate electrodes, high gate resistance has been found to be a significant problem.

Preferably, a hard mask is formed and patterned over the first major surface to define an opening and the semiconductor body is etched through the opening to form the trench. The hard mask may be left in place and used as a mask in subsequent steps. In the finished product, the hard mask may insulate the semiconductor body from the gate electrical connection layer if this extends sideways from the trench over the hard mask, or alternatively the hard mask may be removed.

The step of forming an electrical connection layer may include covering the semiconductor body with a conducting layer and patterning the gate electrical connection layer to span the trench above the first major surface and the dielectric.

The step of filling dielectric into the trench may include the steps of depositing dielectric and etching back the dielectric.

The step of etching back the dielectric may define a gap at the top of the trench; and the step of forming an electrical connection layer may include depositing a conducting layer to fill the gap and to define a plug at the top of the trench. The electrical connection layer may be planarised to remove the electrical connection layer from the first major surface but to leave the plug in the trench in place.

The method may further include the steps of depositing a gate-source insulating layer over the trench to isolate the plug; and depositing a source conducting layer over the gate source insulating layer and the first major surface so that the source conducting layer is in electrical contact with the semiconductor body but insulated from the gate.

In another aspect there is provided a semiconductor device, comprising:

a semiconductor body having opposed first and second major surfaces, the semiconductor body having a highly doped drain layer of a first conductivity type and an lower doped body layer on the highly doped layer facing the first major surface;

a trench extending into the semiconductor body from the first major surface defining opposed sidewalls and a base;

a source region of the first conductivity type laterally adjacent to the trench at the first major surface;

a gate dielectric on the sidewalls and base of the trench;

a gate conducting layer on the sidewalls of the trench but not on the base of the trench;

an insulating dielectric filler extending upwards from the base of the trench between the gate conducting layer on the sidewalls; and an electrical connection layer at the top of the trench above the insulating filler connecting the gate conducting layer across the trench.

The electrical connection layer reduces the gate resistance.

The top of the dielectric filler may be level with the top of the trench and the electrical connection layer may extend across the top of the trench above the filler.

Alternatively, the electrical connection layer may be a plug in the trench above the insulating filler. The top of the plug may be planarised to be level with the top of the trench.

A gate-source dielectric isolation layer may be provided above the electrical connection layer and a source conducting layer isolated from the electrical connection layer by the gate-source dielectric isolation layer and in contact with the source region.

The semiconductor device may have a low-doped drain layer above the highly doped drain layer, underneath the body layer, and the trench may extend though the body layer into the low-doped drain layer. In embodiments, a dielectric plug may be provided in the base of the trench adjacent to the lower doped drain layer. Preferably, the top of the plug is aligned with the boundary between the lower-doped drain layer and the body layer. The plug keeps the gate spaced further form the drain and hence reduces the gate-drain capacitance still further.

For a better understanding of the invention, embodiments of the same will now be described, purely by way of example, with reference to the accompanying drawings in which.

Figure 1:
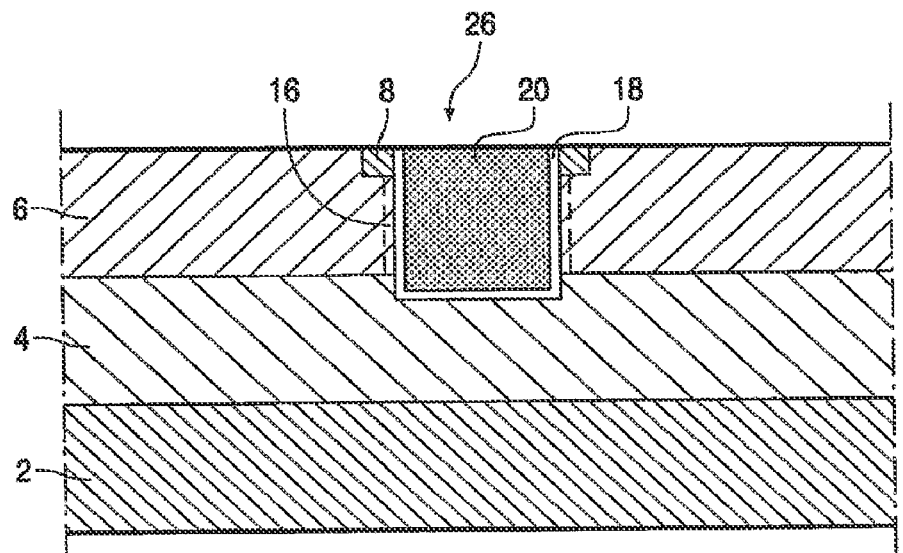
FIG. 1 shows a prior art trench MOSFET.

Referring to FIG. 2, an n+ doped semiconductor substrate 2 has an n– doped drift region 4 formed on top. A lightly p doped channel layer 6 is formed on top of the drift region 4, and an n+ source region 8 is formed on top of the channel region 6, these layers together making up semiconductor body 1. The top of the source region forms a first major surface 10 and the base of the substrate 2 forms a second major surface 12 of the semiconductor body 1. The various regions may be formed by epitaxial growth or by ion implantation through the first major surface 10 as will be appreciated by those skilled in the art: This forms a semiconductor body.

To process this semiconductor body into a trench MOSFET, a lithographic hard mask 14 of oxide is deposited on the first major surface 10 and patterned to have an opening 16. Then, a trench 26 is etched through the opening 16 through the n+ source layer 8 and the p– channel layer 6 as far as the n– drift region 4, to result in the structure shown in FIG. 2a.

Next, a gate dielectric 18 is formed, for example by thermal oxidation.

A gate material layer 20 is deposited over the complete device, and thus on the top of the hard mask 14 away from the trench, on the side wall 22 of the trench and on the base 24 of the trench. This results in the structure shown in FIG. 2b. The gate material layer may be, for example, of heavily doped polysilicon, and in a particularly preferred embodiment the gate material layer may be of polysilicon (germanium).

Figure 2A:
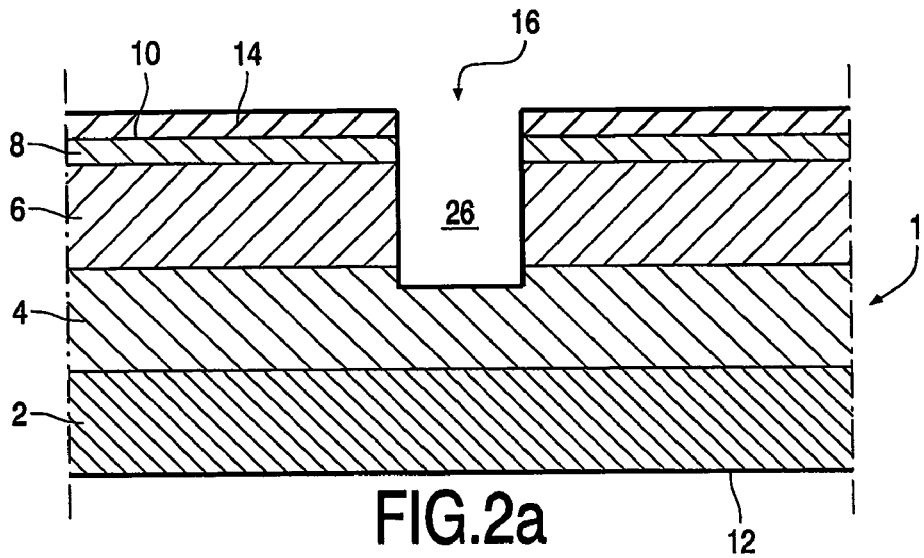
FIGS. 2a to 2f show manufacturing steps used in manufacturing a trench MOSFET according to a first embodiment of the invention.
Figure 2B:
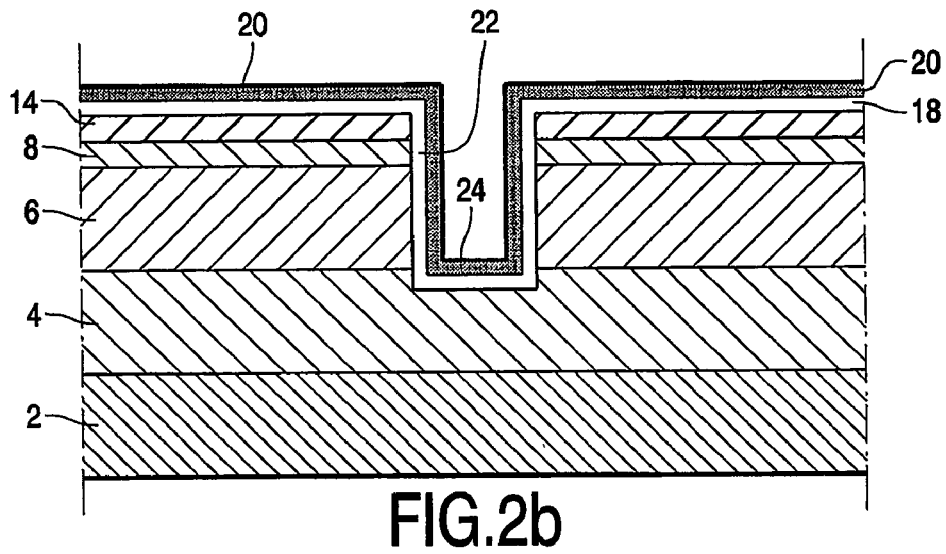
Figure 2C:
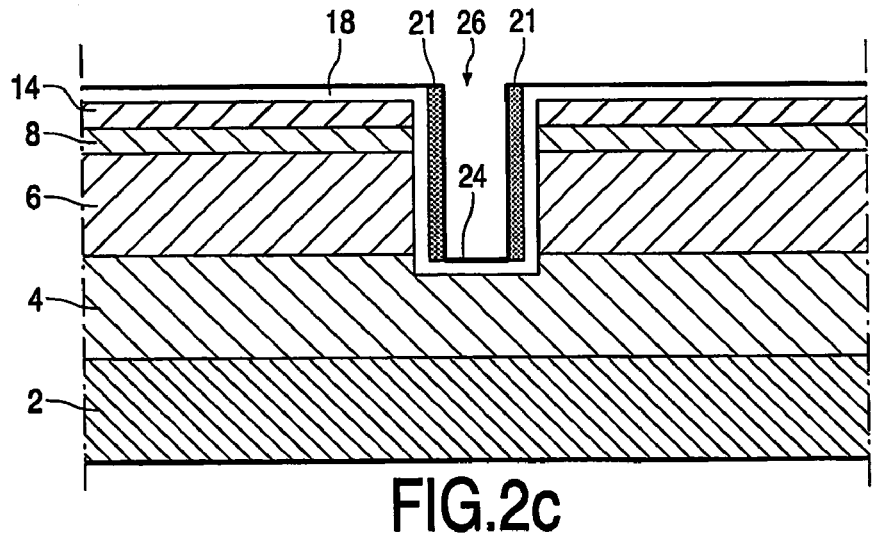

Next, a spacer etch is carried out to remove the unwanted parts of the gate material layer 20, and in particular to remove it from the base 24 of the trench. This leaves the gate material layer 20 only on the side walls 22 of the trench 26, forming an opposed pair of planar gate elements 21 as shown in FIG. 2c. The gate elements 21 make up the gate of the finished device.

Figure 2D:
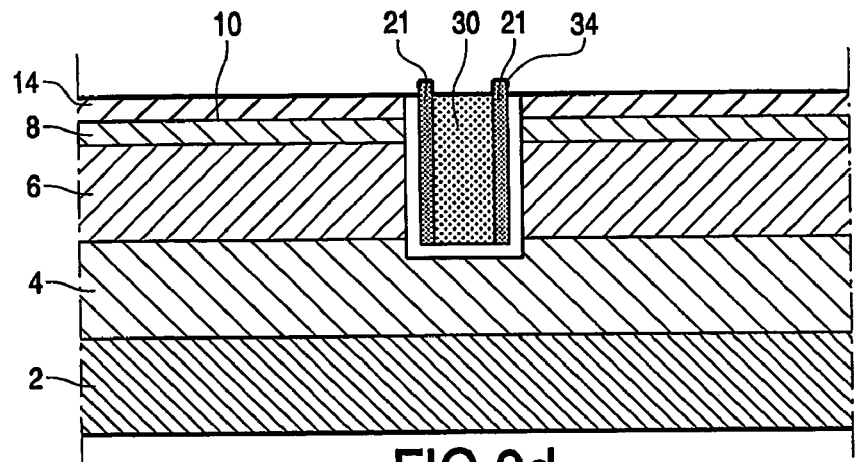
Figure 2E:
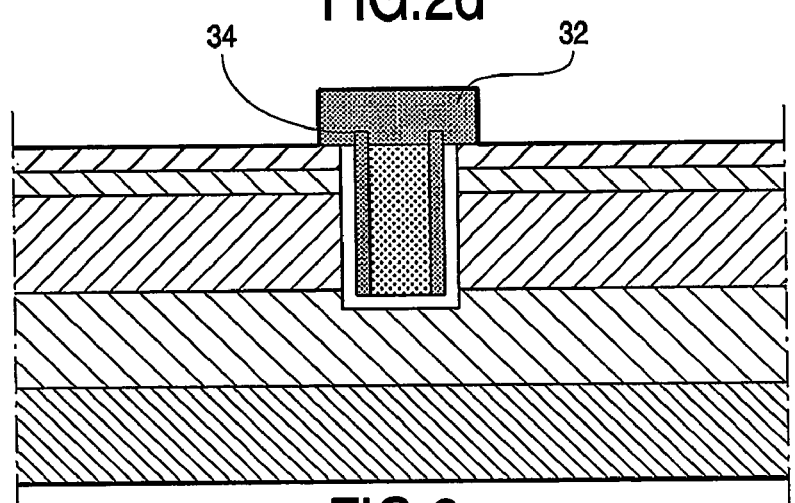
Figure 2F:
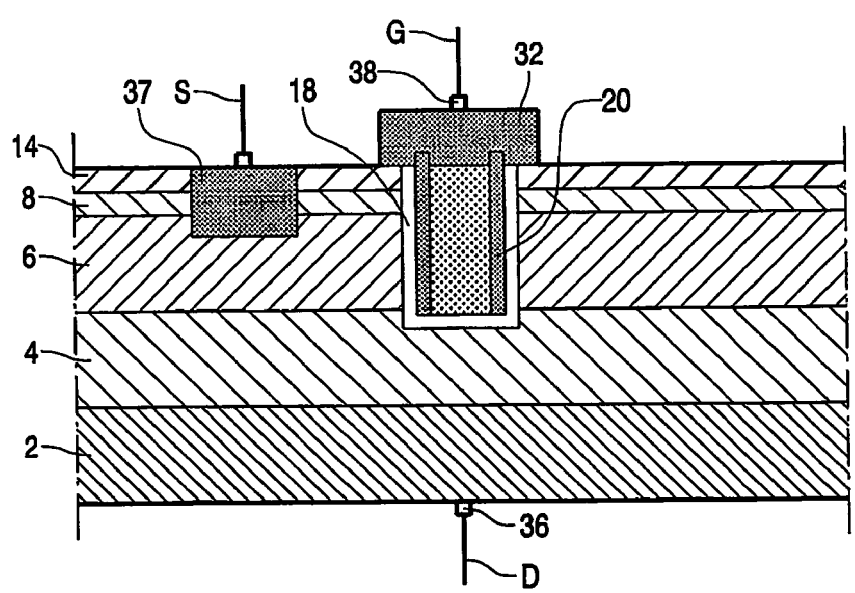

Next, the trench is filled with dielectric 30, for example silicon dioxide. In general, the silicon dioxide will also coat the first major surface 10 with oxide away from the trench, and so an etch back is performed to remove the silicon dioxide except in the trench. It will be noted that a slight over-etch is performed, leaving the gate layer 20 extending above the plane of the first major surface 10, as shown in FIG. 2d.

Next, a conducting gate layer 32, for example a highly doped polysilicon layer, is formed along the hole of the trench and connects to the exposed ends 34 of the gate layer 20. The conducting layer 32 is then patterned so that it covers the trench but extends only slightly over the rest of the semiconductor device. This results in the structure shown in FIG. 2e.

Finally, a source contact 37 is formed to connect to the source layer 8, and also to the p– body layer 6. A drain contact 36 is formed to connect to the drain layer and a gate contact 38 connects to the gate layer 32. This is the structure shown in FIG. 2f which may be packaged as is well known to those skilled in the art.

In use, the hard mask layer 14 isolates gate elements 21 from the source layer 8.

This approach gives rise to a structure in which the capacitance between the gate and the drain is very much reduced over prior art versions. However, this is not achieved at the expense of gate resistance. Gate layer 32 provides a low resistance path along the gate. Even where opposed gate elements 21 are connected along the length of the trench the low resistance path offered by gate electrical connection layer improves the properties of the device.

An alternative method is illustrated in FIG. 3. In this arrangement, the first step are the same as in the first embodiment described above as far as the step shown in FIG. 2c.

Figure 3A:
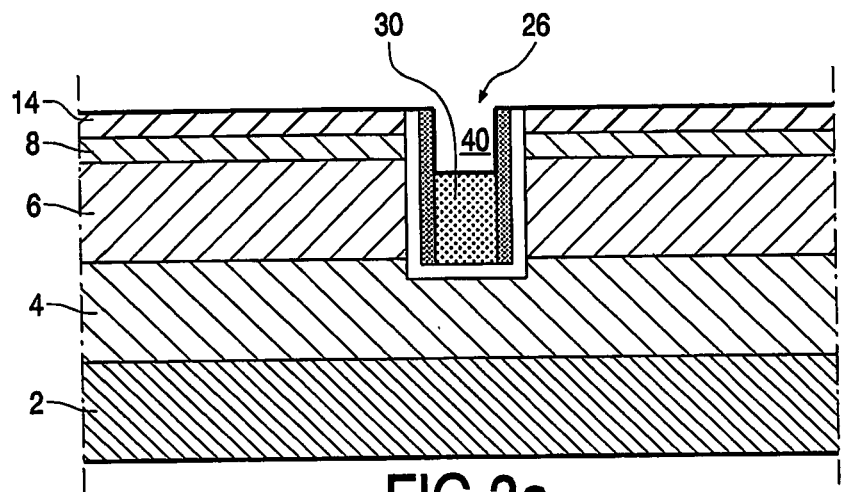
FIGS. 3a to 3c show manufacturing steps used in manufacturing a trench MOSFET according to a second embodiment of the invention.

Next, dielectric 30 is filled into the trench but in this case a substantial over-etch is carried out leaving a hole 40 above the dielectric within the trench 26. This is illustrated in FIG. 3a.

Figure 3B:
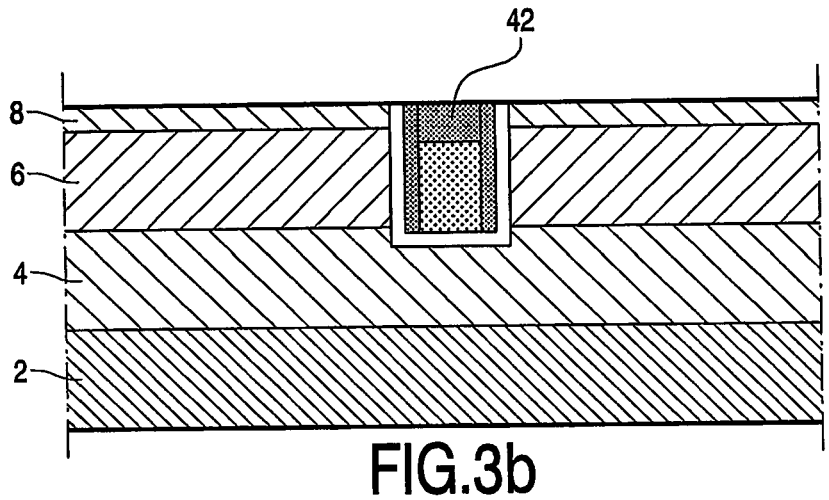

Next, a polysilicon conducting layer 42 is deposited and planarised so as to remain only in the trench as illustrated in FIG. 3b. The hard mask 14 is also removed.

Figure 3C:
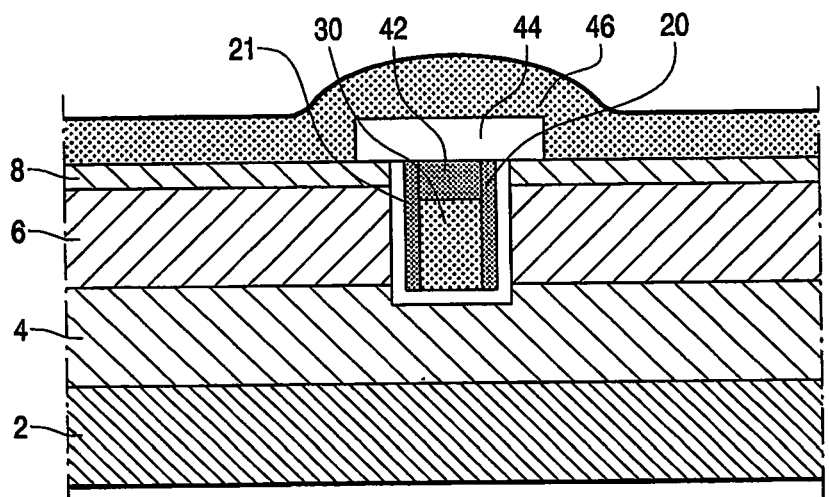

A gate-source dielectric isolation 44 is deposited above the trench and patterned, followed by a source conducting layer 46 which contacts the source layer 8 and is isolated from the gate 20 (constituted by the conducting layer 42 and arms 21) by the gate-source dielectric isolation 44, as shown in FIG. 3c.

As in the first embodiment, contacts are made and the device packaged as is well known.

This second embodiment is particularly good for small pitch sizes and obtaining minimal gate resistance along the length of the gate combined with low gate-drain capacitance.

Figure 4:
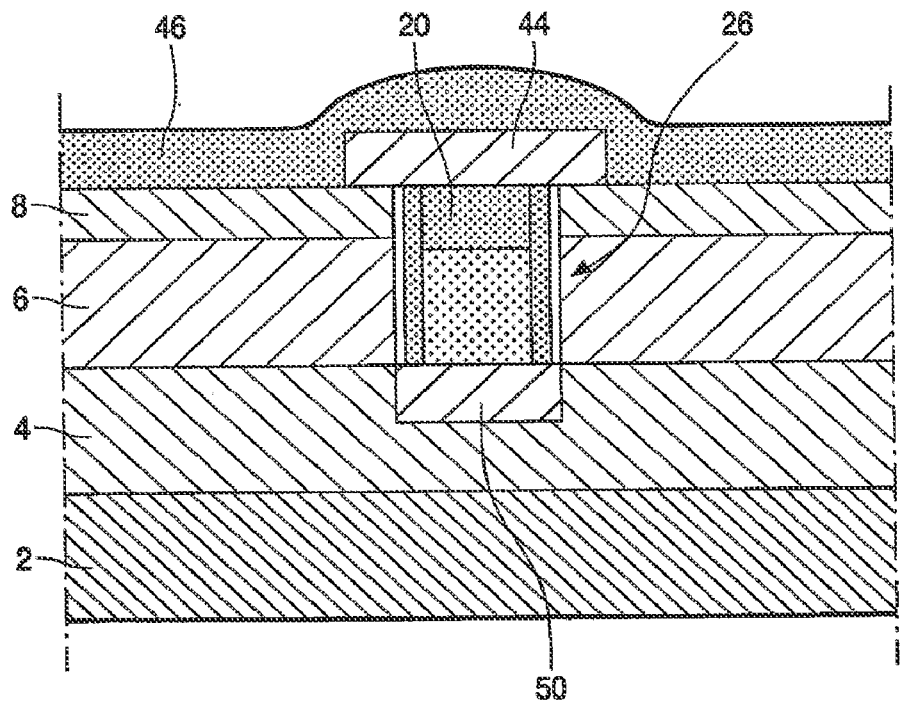
FIG. 4 shows a trench MOSFET according to a third embodiment of the invention.

A third embodiment is illustrated in FIG. 4. After forming the trench 26, an oxide plug 50 is formed at the base of the trench. This may be formed in any of a number of ways. Some of these will be well known to those skilled in the art; for example, the oxide may be deposited and etched back. A specific alternative to forming the plug is to protect the sidewalls of the trench with a nitride layer, to deposit doped polysilicon over the trench, to etch back the polysilicon to leave a polysilicon plug at the base of the trench and then to oxidise the doped polysilicon to form the oxide plug. Doped polysilicon is relatively straightforward to oxidise. A further alternative is to oxidise a porous silicon rather than a polysilicon plug—porous silicon is likewise easy to oxidise.

In the embodiment shown, the top of the oxide plug 50 is aligned to be level with the boundary between the low-doped n-layer 4 and the body layer 6.

The remainder of the processing then proceeds as in the second embodiment to provide gate elements 21 on the sidewalls of the trench adjacent to the body layer 6 but not the low doped n-layer 4. The finished device is illustrated in FIG. 4.

The enhanced spacing between the gate elements 21 and the drain 4 reduces the gate-drain capacitance still further.

As the skilled person will appreciate, an oxide plug can also be used with the arrangement of the first embodiment. Alternatively, the oxide plug can be replaced with any thick dielectric layer to similarly reduce the gate-drain capacitance.

From reading the present disclosure, other variations and modifications will be apparent to persons skilled in the art. Such variations and modifications may involve equivalent and other features which are already known in the design, manufacture and use of trench MOSFETs and which may be used in addition to or instead of features described herein. Although claims have been formulated in this application to particular combinations of features, it should be understood that the scope of disclosure also includes any novel feature or any novel combination of features disclosed herein either explicitly or implicitly or any generalisation thereof, whether or not it mitigates any or all of the same technical problems as does the present invention. The applicants hereby give notice that new claims may be formulated to any such features and/or combinations of such features during the prosecution of the present application or of any further applications derived therefrom.

For example, the gate dielectric is not restricted to silicon dioxide but could be a high-dielectric constant dielectric or a stack of dielectric layers. The gate layer 32 could be highly doped polysilicon, silicided doped polysilicon, tungsten polycide or an appropriate metal or metal nitride such as titanium nitride. All that it requires is that it is a good conductor. Alternative materials for the gate layer 20 are also possible.

Although the described embodiment has a source layer, drain layer, drift region and channel layer, other structures are also known and may be used. For example, the source region may be constituted not by a layer 8 but by source implants implanted adjacent to the trench. The doping in the drift region 4 and channel region may be buried as required.

The invention claimed is:

1. A method of manufacturing a vertical insulated gate transistor comprising the steps of:
    providing a semiconductor body having opposed first and second major surfaces;
    forming a trench extending vertically from the first major surface towards the second major surface;
    forming a gate dielectric layer on the sidewalls and base of the trench;
    depositing a conducting gate material layer on the gate dielectric layer on the sidewalls and base of the trench;
    carrying out a spacer etch to remove the gate material layer from the base of the trench leaving gate material on the sidewalls forming gate elements;
    filling dielectric into the trench between the sidewalls; and
    forming a gate electrical connection layer across the top of the trench electrically connecting the gate material layer across the trench.

2. A method of manufacturing a vertical insulated gate transistor according to claim 1 further comprising:
    forming a hard mask defining an opening on the first major surface of the semiconductor body; and
    etching the semiconductor body through the opening in the hard mask to pattern the trench.

3. A method according to claim 1 wherein the step of forming a gate electrical connection layer includes covering the semiconductor body with a conducting layer and patterning the gate electrical connection layer to span the trench above the first major surface and the dielectric.

4. A method according to claim 1 wherein the step of filling dielectric into the trench includes the steps of depositing dielectric and etching back the dielectric.

5. A method according to claim 4 wherein:
    the step of etching back the dielectric defines a gap at the top of the trench; and
    the step of forming a gate electrical connection layer includes depositing conducting material on the first major surface to fill the gap and to define a plug at the top of the trench and planarising the gate electrical connection layer to remove the electrical connection layer from the first major surface but to leave the plug in the trench in place.

6. A method according claim 1 further comprising the steps of:
    depositing a gate-source insulating layer over the trench to isolate the gate electrical connection layer; and
    depositing a source conducting layer over the gate source insulating layer and the first major surface so that the source conducting layer is in electrical contact with the semiconductor body but insulated from the gate electrical connection layer.

7. A semiconductor device, comprising:
    a semiconductor body having opposed first and second major surfaces, the semiconductor body having a highly doped drain layer of a first conductivity type and lower doped body layer on the highly doped drain layer facing the first major surface;
    a trench extending into the semiconductor body from the first major surface defining opposed sidewalk arid a base;
    a source region of the first conductivity type laterally adjacent to the trench at the first major surface;
    a gate dielectric on the sidewalls and base of the trench;
    opposed gate elements on the sidewalls of the trench but not on the base of the trench;
    an insulating filler extending upwards from the base of the trench between the gate elements; and
    a gate electrical connection layer at the top of the trench above the insulating filler, the gate electrical connection layer connecting the gate elements across the trench; and
        wherein the top of the insulating filler is level with the top of the trench and the gate electrical connection layer extends across the top of the trench above the filler.

8. A semiconductor device according to claim 7 wherein the gate electrical connection layer is a plug in the trench above the insulating filler.

9. A semiconductor device according to claim 8 wherein the top of the plug is planarised to be level with the top of the trench.

10. A semiconductor device, comprising:
    a semiconductor body having opposed first and second major surfaces, the semiconductor body having a highly doped drain layer of a first conductivity type and lower doped body layer on the highly doped drain layer facing the first major surface;
    a trench extending into the semiconductor body from the first major surface defining opposed sidewalls and a base;
    a source region of the first conductivity type laterally adjacent to the trench at the first major surface;
    a gate dielectric on the sidewalls and base of the trench;
    opposed gate elements on the sidewalls of the trench but not on the base of the trench;
    an insulating filler extending upwards from the base of the trench between the gate elements; and
    a gate electrical connection layer at the top of the trench above the insulating filler, the gate electrical connection layer connecting the gate elements across the trench; and
a gate-source dielectric isolation layer above the gate electrical connection layer and a source conducting layer isolated from the gate electrical connection layer by the gate-source dielectric isolation layer and in contact with the source region.

11. A semiconductor device, comprising:
    a semiconductor body having opposed first and second major surfaces, the semiconductor body having a highly doped drain layer of a first conductivity type and lower doped body layer on the highly doped drain layer facing the first major surface;
    a trench extending into the semiconductor body from the first major surface defining opposed sidewalls and a base;
    a source region of the first conductivity type laterally adjacent to the trench at the first major surface;

a gate dielectric on the sidewalls and base of the trench;
opposed gate elements on the sidewalls of the trench but not on the base of the trench;
an insulating filler extending upwards from the base of the trench between the gate elements; and
a gate electrical connection layer at the top of the trench above the insulating filler, the gate electrical connection layer connecting the gate elements across the trench; and
a low doped drain layer over the highly doped drain layer and underneath the body layer, the trench extending through the body layer into the low doped drain layer; and a dielectric plug at the base of the trench.

* * * * *